United States Patent [19]

Stewart

[11] 4,063,225

[45] Dec. 13, 1977

[54] MEMORY CELL AND ARRAY

[75] Inventor: Roger Green Stewart, Neshanic Station, N.J.

[73] Assignee: RCA Corporation, New York, N.Y.

[21] Appl. No.: 664,673

[22] Filed: Mar. 8, 1976

[51] Int. Cl.$^2$ .................. G11C 11/40; H03K 3/26; H03K 3/29

[52] U.S. Cl. ................... 365/156; 307/238; 307/279; 365/155; 365/182; 365/190; 365/188

[58] Field of Search .............. 340/173 FF; 307/238, 307/279, 291

[56] References Cited

U.S. PATENT DOCUMENTS

| | | | |
|---|---|---|---|
| 3,493,786 | 2/1970 | Ahrons et al. | 340/173 R |
| 3,521,242 | 7/1970 | Katz | 340/173 R |
| 3,989,955 | 3/1976 | Suzuki | 307/279 |

*Primary Examiner*—Stuart N. Hecker
*Assistant Examiner*—Donald McElheny
*Attorney, Agent, or Firm*—H. Christoffersen; Henry I. Schanzer

[57] ABSTRACT

An active storage or memory cell includes first and second high input impedance inverters cross coupled to form a flip-flop. The output impedance of the second inverter is significantly lower than the output impedance of the first inverter. Input signals are applied at, and information is read out from, a single input-output point common to the output of the second inverter and the input of the first inverter via a gating means connected between said input-output point and an input-output line which is turned on more slowly than it is turned off.

12 Claims, 1 Drawing Figure

U.S. Patent     Dec. 13, 1977     4,063,225
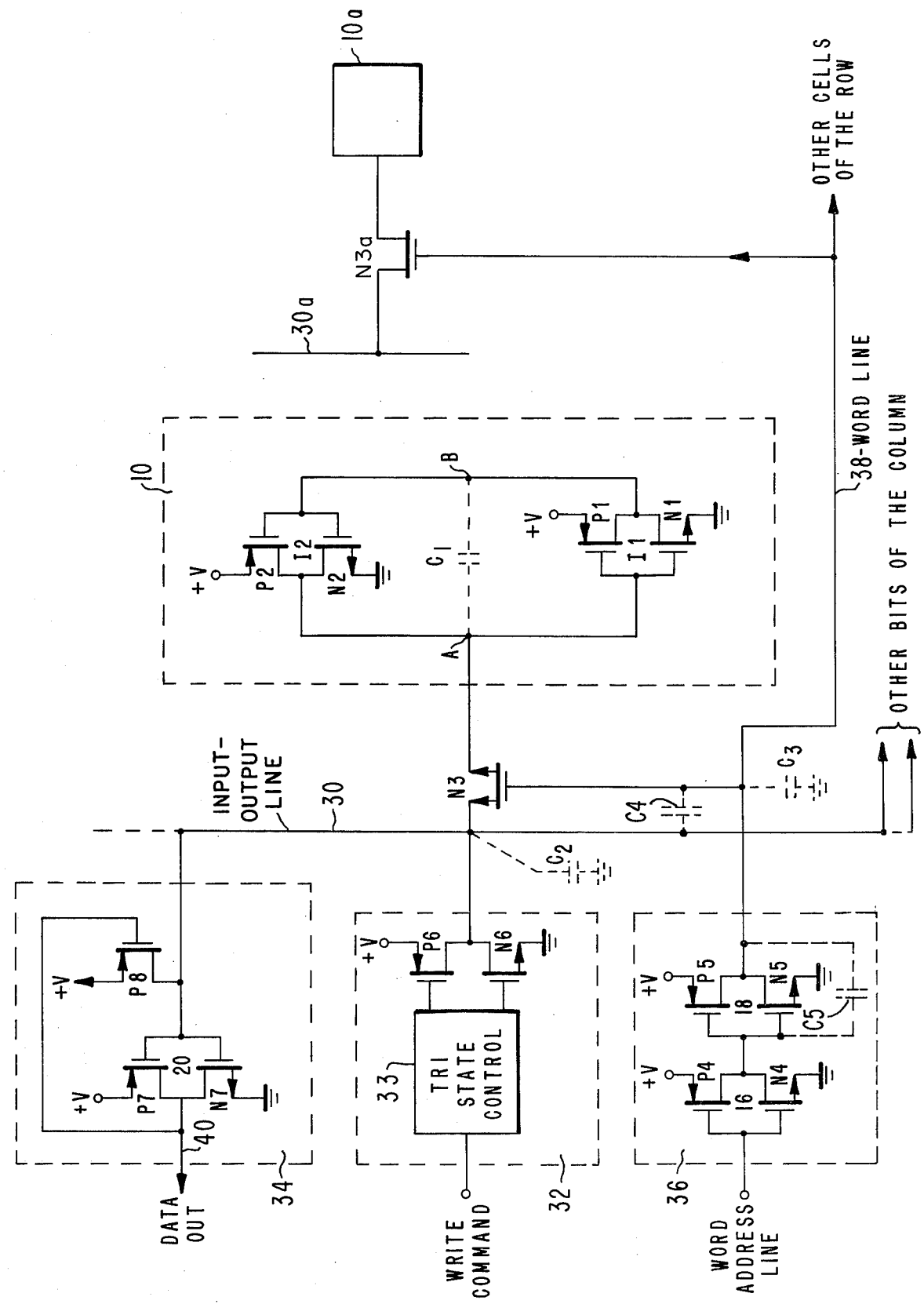

MEMORY CELL AND ARRAY

This invention relates to memory cells, to memory organizations of such cells, and, in particular, to memory cells whose contents are not susceptible to being inadvertently altered.

In the design of large memory arrays, a critical parameter is the largest number of memory cells that can be put on a chip, i.e., the packing density. In order to achieve a high packing density, the number of devices per memory cell must be small and the number of lines to access the cells must be as few as possible.

A known static memory cell which satisfies these general requirements includes 5 transistors per cell and is shown, for example, in FIG. 5 of U.S. Pat. No. 3,521,242 entitled, "Complementary Transistors Write and NDRO for Memory Cell." Four of the five transistors are connected to form a flip-flop. The fifth transistor referred to herein as the "gating" transistor functions as a transmission gate. It is connected between a single input-output point to the flip-flop and an input-output line and is used either to sense the state of the cell or to write information into the cell. The cell has many advantages in that it is small, it can be selected by one work line, and information can be written into the cell and its contents can be sensed by means of the one input-output line.

However, accompanying these advantages are many problems and conflicting design requirements. In order to write into the cell the impedance of the gating transistor must be made as low as possible to enable the cell to change state and to accept new information during a write operation. But, when reading the information contained in the cell, it is necessary that the gating transistor have a relatively high impedance in order to prevent the information on the input-output line from overriding and altering the contents of the memory cell.

Techniques have been developed in the prior art for minimizing the above problem. One technique is to make the impedance of the gating transistor high whereby the cell can be read out non-destructively. When it is desired to write information into the cell various approaches may be used. U.S. Pat. No. 3,521,242 for one, mentions overdriving the control electrode of the gating transistor to lower the impedance of its conduction path to ensure tighter coupling. This, however, requires the availability of a higher amplitude potential, or the generation of a higher amplitude potential, than the memory cell operating potential. Also, applying pulses of high amplitude to the address lines increases transient spikes and the noise level in the circuit making it more susceptible to random failures. Another approach for writing into the cell is to modify its operating potential. This is disadvantageous in that it requires special additional circuitry and may limit the range of potential over which the circuit operates. Still another technique teaches precharging the sense lines to a voltage level that will not cause the cell to change its state when the gating transistor is turned on. But, this technique requires special additional charging circuits and may require extra timing pulses and/or dissipate more quiescent power.

In addition, when a single gating transistor is used a problem arises because, for one value of signal in either the write mode or the read mode, the gating transistor operates in the (source or emitter) follower mode. In this mode, there is a voltage offset ($V_T$ or $V_{BE}$) between the control electrode (gate or base) of the transistor and one end of its conduction path and this same offset appears across the conduction path of the transistor. As a result: a) during the write mode the one value of signal is not fully applied to the flip-flop making it difficult to write that condition; and b) during the read mode the one value of signal is not fully applied to the input-output line and to the sense circuit connected thereto. As a result, during the read mode, devices connected to the input-output line may not be fully turned on or off causing an increase in power dissipation and creating ambiguity in the value of the read out.

A prior art technique for minimizing the write mode problem relies on making the input impedance of the flip-flop high to enable information to be easily written into the flip-flop as set forth in U.S. Pat. No. 3,493,786 to R. W. Ahrons et al entitled, "Unbalanced Memory Cell." The problem with such an approach in a five transistor cell where the read-out is the same point as the write-in is that when the input impedance to the flip-flop is high, the flip-flop presents very little loading to signals applied to its input and is susceptible to its contents being inadvertently altered. Also, the read out of the cell contents is very slow.

Thus, it has been found that when the five transistor cell is made as taught in the prior art, that the contents of the cell are susceptible to being inadvertently altered during read out or under noisy conditions. This is especially so in large arrays where the capacitance of the data sense line is relatively large compared to the cell capacitance.

In circuits embodying the invention a pair of inverters are cross-coupled to form a flip-flop. One of the two inverters is made with an output impedance which is lower than that of the other. The circuit further includes input means for selectively coupling a single input-output line to a single input-output point common to the output of the lower output impedance inverter and the input of the high output impedance inverter. This renders the cell relatively impervious to noise pulses and to, relatively short term transients coupled to the flip-flop during address write changes or when the contents of the cell are being read out.

The input means preferably comprises a single transistor transmission gate connected between the single input-output point of the cell and the input-output line and includes means for turning on the gating transistor relatively slowly and turning it off relatively quickly.

Circuits embodying the invention may also include means for sensing the information contained in the cell which compensate for the follower mode operation of a single transistor transmission gate coupling the output of the flip-flop to an input-output line.

The sole FIGURE includes a schematic diagram of a memory cell embodying the invention and includes a semi-schematic and semi-block diagram of a portion of a memory array embodying the invention.

The active devices which are preferred for use in practicing the invention are those of a class known in the art as insulated-gate field-effect transistors. For this reason, the circuit is illustrated in the drawing as employing such transistors and will be so described hereinafter. However, this is not intended to preclude the use of other suitable devices and to this end, the term "transistor," when used without limitation in the appended claims, is used in a generic sense.

In the FIGURE, transistors of P-conductivity type are identified by the letter P followed by a particular reference numeral and transistors of N-conductivity type are identified by the letter N followed by a particular reference numeral.

In the FIGURE, the "flip-flop" 10 is shown as comprising two cross-coupled inverters $I_1$ and $I_2$. Inverter $I_1$ includes transistors P1 and N1 and inverter $I_2$ includes transistors P2 and N2. The sources of transistors N1 and N2 are connected to a point of reference potential, indicated as circuit ground, and the sources of transistors P1 and P2 are connected to a point of positive operating potential, indicated as +V volts.

The drains of transistors P1 and N1 are connected to each other and to the gates of transistors P2 and N2. In a similar manner, the drains of transistors P2 and N2 are connected to each other and to the gates of transistors P1 and N1.

The flip-flop, as thus far described, is schematically the same as the flip-flop shown in FIG. 1 of U.S. Pat. No. 3,493,786 or FIG. 5 of U.S. Pat. No. 3,521,242. The difference is in the selection of the transistors in the FIGURE of this application. Transistors P1 and N1 in inverter $I_1$ are selected to have significantly higher impedance conduction channels than transistors P2 and N2 in inverter $I_2$ for the same value of forward source-to-gate bias. That is, the impedance of the conduction channel of transistor N1 is greater than the impedance of the conduction channel in transistor N2 when the gates of these transistors are each at +V volts. Correspondingly, the impedance of the conduction path of transistor P1 is significantly greater than that of transistor P2, when the gates of these transistors are at ground potential. The importance of this feature is discussed below.

Node A, common to the drains of transistors P2 and N2 serves as the common input-output point of the flip-flop 10. Node B is common to the drains of transistors P1 and N1 and the gates of transistors P2 and N2. The discrete and distributed gate-to-drain capacitances of the transistors of inverters $I_1$ and $I_2$ is represented in phantom view and denoted as C1. In contrast to prior art circuits, capacitance C1 is purposely made relatively large for reasons to be discussed below. As is well know the value of capacitance C1 may be increased by the manner in which the components are laid out and in the manner in which the gate electrodes are formed, interconnected, and cross-coupled.

The flip-flop just described is bistable and, in either steady state draws no appreciable current, whereby the steady state power dissipation is extremely low. When transistors N1 and P1 have +V volts applied at their gates transistor N1 is biased on and transistor P1 is biased off. The voltage at node B then is zero volts and little current flows through the conduction path of transistor P1. The zero volts is applied at the gates of transistors N2 and P2, turning transistors N2 off and biasing transistor P2 on. The voltage at node A then is +V volts, which voltage maintains transistors N1 and P1 in the state indicated above. The memory cell may be considered to be storing a binary "1" bit under these conditions.

In the other stable state, transistors N1 and P2 are turned off and transistors N2 and P1 are turned on. The voltage at node B then is +V volts, and the voltage at node A is at ground potential. The memory cell may then be considered to be storing a binary "0" bit.

A fifth gating transistor N3, which is preferably selected to have a lower impedance conduction path than transistors P2 and N2 for the same value of forward gate-to-source bias, has its conduction channel connected between node A and an input-output (I/O) line 30. A write driver circuit 32, which may be any one of a number of known tri-state circuits, and a sense circuit 34 are connected to line 30. When transistor N3 is turned on, flip-flop 10 is closely coupled to line 30. Information on line 30 can then be written into the flip-flop or the state of the flip-flop can be read out (sensed) onto line 30. When transistor N3 is turned off flip-flop 10 may be considered to be electrically disconnected from line 30.

The output stage of write circuit 32 includes transistor P6 and N6 connected at their drains to line 30 with transistor P6 connected at its source to +V volts, and transistor N6 connected at its source to ground potential. The impedance of the conduction path of transistor P6 or transistor N6 is preferably lower than that of transistor N3 for the same value of forward bias. The conductivity of transistors P6 and N6 is controlled by means of TRI-STATE CONTROL circuit 33, which may be any one of a number of known circuits, to which is applied a write command signal. In response to a write "1" command (not shown) transistor P6 is turned on (transistor N6 is turned off) and clamps line 30 through its low "on" impedance to +V volts. In response to a write "0" command (not shown) transistor N6 is turned on (transistor P6 is turned off) and clamps line 30 to ground through its low "on" impedance. During a read cycle, or in the absence of a write command, transistors P6 and N6 are both turned off.

The sense circuit 34 includes an inverter 20 comprising transistors P7 and N7 having their gates connected to line 30, their drains connected to DATA OUT line 40, with the source of transistor P7 connected to +V volts and the source of transistor N7 connected to ground potential. Sense circuit 34 also includes transistor P8 having its source-drain path connected between +V volts and line 30 and its gate connected to the drains of transistors P7 and N7. The impedance of the conduction path of transistor P8 is preferably made very high.

The gate electrode of transistor N3 is connected to a word line 38, which line is common to all of the memory cells of the same word in a word organized memory. By the same token, line 30 is common to all of the bits of like significance in the several words. The word line 38 is driven by a special decoder circuit 36 comprising two cascaded complementary inverters 16 and 18. Inverter 16 comprises transistors P4 and N4 and inverter 18 comprises transistors P5 and N5. The gate-to-drain capacitance of transistors P5 and N5 denoted C5 is shown in phantom view. The gates of transistors P4 and N4 are connected to a word address line and their drains are connected to the gates of transistors P5 and N5 whose drains are connected to line 38. Transistor N4 is, preferably, a relatively large impedance device while transistors P4, P5 and N5 are, preferably, relatively low impedance devices. The importance of this feature is discussed below.

In large arrays the distributed capacitance associated with line 30, shown in phantom view and denoted as C2, may be relatively large. This may cause serious problems when the contents of the cell are to be nondestructively read out. If line 30 is charged to a level which is different than the level stored in the cell, the quick and sharp turn on of transistor N3 could cause the information on line 30 to override the cell information since C2 is much larger than the capacitance at node A.

For example, if capacitance C2 and line 30 were discharged to ground potential with node A at +V volts, and transistor N3 were turned on quickly, then the signal at node A could be pulled down towards ground causing flip-flop 10 to change state. Thus, low impedance transistor N3 would normally cause the inadvertent writing of false information into the cell during address changes or during the read cycle.

This and other potential failures are avoided by deliberately reducing the transconductance of transistor N3 during read address changes by shaping the voltage waveform at the gate of transistor N3. This is accomplished with the special address decoder 36, which rapidly discharges the potential on the address line 38 but charges it slowly with a voltage ramp controlled, in part, by transistor N4 and the capacitance C5 associated with inverter 18.

Decoder 36 is also used to solve the following problem. In large arrays, the distributed capacitance between lines 30 and 38, shown in phantom view and denoted as C4, may be relatively large. The gate-to-drain/source capacitance of many gating transistors are effectively connected in parallel causing C4, to be a relatively large capacitance. This capacitance may cause the response of the system to be sensitive to the pattern stored in the memory array. For example, assume all the flip-flops of a word to be storing a "1" (A at +V volts) and all the I/O lines to be initially at the low level. As soon as the turn on signal applied to line 38 would reach the threshold voltage of the gating transistors and the +V volt level at the I/O point of each flip-flop of the word would be coupled to its I/O line and be positively fed back, via capacitance C4, to the gate electrodes of the gating transistors causing them to turn on extremely quickly.

On the other hand, if a "0" (A at 0 volts) were stored in each flip-flop of a word then, upon turn on of the gating transistors, the 0 volt level signal would be coupled to all the I/O lines and a negative going signal would be coupled via capacitor C4 to the gate electrode of each gating transistor. This would tend to turn off the gating transistors causing them to turn on relatively slowly. Thus, the turn on and turn off of the gating transistors would be pattern sensitive (i.e. sensitive to the pattern stored in the flip-flops).

This problem is solved by making transistors P5 and N5 relatively low impedance conduction devices. Line 38 is driven by their low impedances and they will attenuate the signals fed back via capacitor C4 onto line 38 rendering the turn on of transistor N3 pattern insensitive. Although P5 is a relatively low impedance device, it must be turned on slowly to turn on transistor N3 slowly.

The ramping of the turn on signal applied to the gate of transistor N3 is achieved by making transistor N4 a relatively high impedance device. When transistor N4 is turned on, the potential on word line 38 does not make a sharp transition from ground to +V volts but, rather, rises slowly with a time constant determined by the impedance of transistor N4 and the capacitance C5. Since transistor N4 is a high impedance device it turns on slowly which also turns transistor P5 on slowly. The slow turn on of transistor P5 ensures that the potential level on line 38 ramps up relatively slowly. The effect of applying a ramp to the gate of transistor N3 causes it to also be turned on slowly which makes it appear as a relatively high impedance device during the turn on period. Turning transistor N3 on slowly, enables the information at node A to control the level on line 30 during the read cycle. During the read cycle there are no low impedance paths coupling line 30 to either +V volts or ground. Only the high source-drain impedance path of transistor P8 is connected between +V volts and line 30.

Turning transistor N3 on slowly enables transistor P2 (N2) to drive node A and to supply (draw) current through transistor N3 charging (discharging) the capacitance $C_2$ of line 30 to the condition existing at node A. The duration of the ramp allows the memory cell enough time to pull-up the data sense line 30 to a safe value of potential before exposing the cell to the data sense line via a low impedance, high transconductance, connection.

Decoder 36 also ensures that a "dead zone" or open circuit condition occurs on all of the data bus lines during each address change. At the beginning of a read or write cycle the non-selected word lines are clamped to ground relatively quickly by means of transistor N5 while the potential on the selected word line is slowly ramped up. This dead zone ensures that no two memory cells are connected to the same data sense line at the same time.

Another mechanism for preventing the contents of the cells from being inadvertently altered lies in the use of the relatively low output impedance inverter $I_2$ to drive the input-output point A and of the relatively high output-impedance inverter $I_1$ to drive the input of inverter $I_2$.

In the steady state condition either transistor P2 or transistor N2 is conducting. When P2 is conducting, it clamps node A to +V volts through its low on impedance. When transistor N2 is conducting it clamps node A to ground through its low on impedance. When transistor N3 is turned on, line 30 is coupled via the source-drain impedance of transistor N3 to node A. Transient disturbances coupled from I/O line 30 to node A are greatly attenuated, being clamped to ground or +V volts by means of transistors P2 or N2. To cause the flip-flop to change states, the disturbance coupled to node A must contain sufficient energy to overcome the clamping action of transistor N2 or transistor P2 and must be applied for the length of time it takes P1 or N1 to charge or discharge node B.

Although, the flip-flop is deliberately "slowed down" made unresponsive to transients on line 30, it responds to direct current levels of correct amplitude impressed on line 30 and is, therefore, "writeable."

During the write cycle, transistor N3 is turned on, and information may be written into the flip-flop 10 by driving line 30 to +V volts or ground via transistor P6 or N6, respectively, for a period of time which is greater than the time which it takes to charge or discharge node B via transistor P1 or N1, respectively. The write driver P6 when turned on can force flip-flop 10 to switch from "0" to "1." Since transistors P6 and N3 have lower souce-drain impedances than transistors P2 or N2, transistors P6 and N3 (although the latter is operating in the source follower mode), when turned on, can overcome the clamping action of transistor N2, causing the potential at node A to rise above the threshold voltage ($V_T$) of transistor N1 causing it to discharge to ground the side of capacitance C1 connected to node B. Since the conduction path of transistor N1 is a relatively high impedance path, the time to discharge node B is relatively long. When node B is discharged such that the potential at node B decreases below the $V_T$ of transistor P2, the latter turns on and quickly clamps node A to +V volts.

Similarly, write driver N6, when turned on, can force flip-flop 10 to switch from "1" to "0." Transistors N6 and N3 when turned on can overcome the clamping action of transistor P2 lowering the potential at node A until P1 starts to conduct and N1 is turned off. When transistor P1 is on for a sufficiently long period of time to charge node B above $V_T$ of transistor N2, the latter turns on and clamps node A to ground and the cell flips.

Thus, the high impedance of inverter I₁ used to protect against read mode errors, increases the time it takes to write but does not make the write operation more difficult.

Another feature present in cell 10 is the role played by capacitance C1 connected between nodes A and B. The capacitor C1 couples transient signals form node A to the gates of transistors N2 and P2 in a direction to maintain transistors P2 and N2 in the condition they had prior to the disturbance. For example, the problem of inadvertently altering the contents of a memory cell occurs, when the information on the line 30 is different than the contents of the cell. When that condition exists, and transistor N3 is turned on, a voltage shift occurs at node A. Assume, for example, that line 30 is high (+V volts) and that node A is initially low (0 volts) and that transistor N3 is turned on. For node A to be low, transistors P1 and N2 must be turned on, node B is high, and transistors N1 and P2 are turned off. The +V volts signal on line 30 coupled through transistor N3 to node A may cause a positive going change in potential at node A. The positive going change at node A is coupled through capacitor C1 to node B with little attenuation and little phase shift. Since node B is already charged to +V volts and since transistor N1 is off and transistor P1 (although turned on) is a high impedance device, the positive going transient coupled to node B can overshoot above +V volts and be applied to the gates of transistor P2 and N2. This causes transistor N2 to be overdriven into greater conduction and transistor P2 to be positively turned off. Transistor N2 then functions to clamp node A more closely to ground potential.

Of course, the positive going transient coupled through transistor N3 to node A also tends to turn on transistor N1 and turn off transistor P1. But, since transistor N1 is a high impedance device the potential on capacitor C1 at node B can only be discharged relatively slowly. Therefore, the signal at the output of inverter I₁ due to the conduction of transistor N1 will be delayed.

In general, the combination of transistors P1 and C1 or transistor N1 and C1 ensures that the potential at node B, due to the conduction of transistors P1 or N1, can only change slowly. In contrast thereto, the gate-to-drain capacitance C1, which is also multiplied by the Miller Effect, enables instantaneous coupling of signals between nodes A and B.

In a similar manner to the example above, a negative going transient applied to node A, when the latter is at +V volts, is coupled via C1 to node B causing its potential to go below ground and thereby turning transistor P2 on harder. Thus, a transient having a tendency to upset the contents of the cell causes an amplified feedback signal in a direction to prevent or inhibit the possibility of the upset.

The high degree of stability of the flip-flop ensures reliable operation and certainty of read out. In addition, since the flip-flop is very stable it is capable of driving line 30. Accordingly, in circuits embodying the invention the I/O line need not be precharged. Thus, making the impedance of the I/O point of the flip-flop relatively low provides a significant advantage, and also speeds up the read access time of the memory. Although the high impedance inverter I₂ slows the write operation, this effect is not important since the operating speed of the memory is usually limited by read access time and the write operation is not in the critical path.

Sense amplifier 34 is designed to correct for source follower effects in memory cells employing a single transistor transmission gate. The information stored in flip-flop 10 is read out when transistor N3 is turned on by the application of +V volts to its gate. If node A is at or close to zero volts, due to the conduction of transistors N2, then transistors N2 and N3 conduct in the common source mode and clamp line 30 to ground via their low impedance conduction paths. Thus, since transistor N3 is of N conductivity type, a "low" level stored in flip-flop 10 is rapidly and completely read out onto line 30 when transistor N3 is turned on. However, when a +V volts level at node A is to be read out, transistor N3 operates in the source follower mode. Although, transistor N3 has +V volts applied to its gate, it can only drive the potential on line 30 to an intermediate value equal to $(+V - V_{TN})$ volts; where $V_{TN}$ is the threshold voltage of transistor N3. This intermediate voltage level may result in the flow of large leakage currents in the sense amplifier or in any other device having an input connected to line 30. For example, transistor N7 is turned on and transistor P7 will be partially turned on or may be fully turned on when the potential on line 30 is equal to $(+V - V_{TN})$ and $V_{TN}$ is greater in amplitude than $V_{TP}$, where $V_{TP}$ is the threshold voltage of transistor P7.

Sense amplifier 34 is designed to solve this problem. Firstly, the impedance of transistor N7 is made lower than that of transistor P7 for the same value of gate-to-source potential. This lowers the point at which the sense amplifier toggles and corrects for delays due to the source follower action of transistor N3, effectively equalizing the time it takes to read out a "1" or a "0."

Secondly, the sense amplifier includes high impedance "bootstrap" transistor P8. When a high level logic "1" begins to be read out onto line 30, its potential begins to increase and the voltage at the drains of transistors P7 and N7 begins to fall. When this occurs, transistor P8 begins to be turned on and to supply current to charge up line 30. As transistor P8 conducts more, the DATA OUT 40 goes more negative providing more forward bias to transistor P8 until it is fully on. Since transistor P8 is operated in the common source mode, it will eventually, in the absence of any dc loading, drive line 30, which is very lightly loaded, all the way to +V volts. The addition of transistor P8 to inverter 20, therefore, eliminates the leakage problem that might otherwise exist if a conventional inverter were used with its input connected to line 30.

In a similar manner to the above, if the gating transistor were of P-conductivity type it would operate in the source follower mode when a zero volt level signal at node A were to be read-out. For that condition, the potential on line 30 could not be reduced below the $V_{TP}$ of the P-type gating transistor. The sense amplifier, for use in conjunction therewith, would then include a complementary inverter (transistors P7 and N7) and a transistor of N-conductivity type having its conduction path connected between line 30 and ground and its control electrode connected to the output of the complementary inverter.

What is claimed is:

1. The combination comprising:
   first and second inverters, each inverter having an input and an output, the inverters being characterized in that they both have a high input impedance and the output impedance of the second inverter being significantly less than the output impedance of the first inverter for the same turn on bias condition;
   a common input-output point;
   means cross-coupling the two inverters for forming a flip-flop including means connecting the output of the first inverter to the input of the second inverter, and negligible impedance means connecting the input of the first inverter and the output of the second inverter to said input-output point; and
   input means connected to said input-output point for selectively setting said flip-flop and for selectively sensing the state of said flip-flop.

2. The combination as claimed in claim 1 wherein said input means includes: a) a single input-output line adapted to receive signals to be applied to said input-output point or to receive signals from said input-output point; b) a gating transistor having a conduction path and a control electrode, said conduction path being connected between said input-output point and said input-output line; and c) gating control means connected to the control electrode of said gating transistor for turning off said gating transistor relatively quickly and for turning it on relatively slowly.

3. The combination as claimed in claim 2 wherein each one of said first and second inverters includes first and second transistors each transistor having first and second electrodes defining the ends of a conduction path and a control electrode; wherein the control electrodes of the first and second transistors of an inverter are connected to the input of that inverter, wherein the first electrode of the first transistor of each inverter is connected to a first point of operating potential, wherein the first electrode of the second transistor of each inverter is connected to a second point of operating potential and wherein the second electrodes of the first and second transistors of each inverter are connected to the output of that inverter; and
   wherein the impedances of the conduction channels of the transistors of the first inverter are greater than the impedances of the conduction channels of the devices of the second inverter for the same value of turn on signal.

4. The combination as claimed in claim 3 wherein each one of said transistors is an insulated-gate field-effect transistor having a gate electrode and source and drain electrodes defining the ends of a conduction path; wherein said control electrode of each transistor is said gate electrode, each one of said first electrodes is a source electrode, and each one of said second electrodes is a drain electrode; and wherein the first transistors of each one of said inverters is of one conductivity type and wherein the second transistors of each one of said inverters is of another, second conductivity type.

5. The combination as claimed in claim 4 wherein the time constant to charge or discharge the output of said first inverter is greater than the time constant to change or discharge said input-output point, or said input-output line by means of said second inverter.

6. The combination as claimed in claim 2 wherein said gating control means includes first and second control transistors each having a control electrode and a conduction path; conduction paths of said first and second control transistors being relatively low; and
   wherein the conduction path of the first control transistor is connected between a first point of potential and the control electrode of said gating transistor for turning it off; and wherein the conduction path of said second control transistor is connected between a second point of potential and the control electrode of said gating transistor for turning it on.

7. The combination as claimed in claim 6 wherein said gating control means further includes means applied to the control electrodes of said first and second control transistors for turning said second control transistor on more slowly than said first control transistor.

8. The combination as claimed in claim 2 further including means for sensing on said input-output line the signal received from said input-output point comprising a sensing inverter having an input connected to said input-output line and an output connected to a data output line; and a semiconductor device having a control electrode connected to the output of said sensing inverter and having a conduction path of relatively high impedance connected between a point of potential and said input-output line for providing regenerative feedback between the output and the input of said sensing inverter for only one signal condition.

9. The combination as claimed in claim 8 wherein said regenerative feedback device is an insulated-gate field-effect transistor of complementary conductivity type to the conductivity of the gating transistor; and
   wherein the impedance of the conduction path of said feedback transistor is much greater than that of said gating transistor for the same value of forward bias.

10. The combination comprising a flip flop having an output point and a single gating transistor having its conduction path connected between said output point and a single sense line, and wherein for one value of stored data said gating transistor conducts in the follower mode whereby the value of the signal read out on said sense line is offset;
    a high input impedance inverter having an input and an output and first and second power terminals for the application therebetween of an operating potential; said input being connected to said sense line, and said output being connected to a data output line; and a feedback transistor of different conductivity type than said gating transistor having first and second electrodes defining the ends of its conduction path and a control electrode; said control electrode being connected to said data output line, one end of said conduction path being connected to said sense line and the other end of said conduction path being connected to that one of said first and second power terminals having a value to reduce said offset, whereby said feedback transistor, when turned on, reduces said offset.

11. The combination as claimed in claim 10 wherein said inverter is a complementary inverter having a first transistor of one conductivity type and a second transistor of second conductivity type; wherein said gating transistor is of one conductivity type and said feedback is of second conductivity type; and wherein said other end of said conduction path of said feedback transistor is connected to the same power terminal as said second transistor.

12. The combination as claimed in claim 11 wherein the impedance of the conduction path of said feedback transistor is significantly greater than that of said gating and first and second transistors for the same value of forward bias.

* * * * *